United States Patent [19]
Take

[11] Patent Number: 5,345,183
[45] Date of Patent: Sep. 6, 1994

[54] DIELECTRIC CONSTANT-MEASURING APPARATUS

[75] Inventor: Masafumi Take, Tokyo, Japan

[73] Assignee: Seiko Instruments Inc., Tokyo, Japan

[21] Appl. No.: 59,392

[22] Filed: May 11, 1993

[30] Foreign Application Priority Data

May 11, 1992 [JP] Japan .................................. 4-117782

[51] Int. Cl.$^5$ .......................................... G01R 27/26
[52] U.S. Cl. .................................... 324/663; 324/444
[58] Field of Search .............. 324/663, 664, 669, 683, 324/444, 713; 73/61.41, 61.43, 61.44

[56] References Cited

U.S. PATENT DOCUMENTS

| | | | |
|---|---|---|---|
| 3,757,205 | 9/1973 | Dauphinee | 324/444 |
| 4,808,931 | 2/1989 | Ling | 324/444 |
| 5,134,380 | 7/1992 | Jones | 324/663 |
| 5,177,445 | 1/1993 | Cross | 324/663 |
| 5,272,444 | 12/1993 | Cox | 324/683 |

FOREIGN PATENT DOCUMENTS 404151568  5/1992  Japan .................................. 324/663

OTHER PUBLICATIONS

Third International Conference on Dielectric Materials Measurements and Applications Birmingham, England (Sep. 10-13, 1979), Noyd et al.

*Primary Examiner*—Maura K. Regan
*Attorney, Agent, or Firm*—Spensley Horn Jubas & Lubitz

[57] ABSTRACT

Important portions for measurements such as measurement of a peak value can be measured with a substantially constant accuracy, by making an applied sinusoidal wave variable. An amplitude adjuster is disposed behind a sinusoidal wave generator. A sinusoidal wave applied to a voltage electrode is variable. An electrical current induced in a current electrode according to the nature of a sample is fed to an arithmetic portion via a current detector, a peak value-measuring device, and an A/D converter. The arithmetic portion performs a calculation. Then, an amplitude applied to the voltage electrode is determined and adjusted by the amplitude adjuster.

2 Claims, 2 Drawing Sheets

DIELECTRIC CONSTANT-MEASURING APPARATUS

BACKGROUND OF THE INVENTION

The present invention relates to a dielectric constant measuring apparatus detecting the dependence of the dielectric property of a sample on temperature, time, or frequency and, more particularly, to an improvement in the accuracy of data obtained by such measurement.

One conventional technique of this kind consists in applying a sinusoidal wave voltage of a given amplitude dependent on the dielectric constant of a sample, detecting the current induced in the sample at this time, and determining the complex dielectric constant from the correlation between the sinusoidal wave voltage and the current.

In the above-described prior art technique, the voltage of constant amplitude is applied without considering variations in the dielectric constant of the sample during measurement. Therefore, if the dielectric constant of the sample rises, the current increases. As a result, the dynamic range of the current detector is exceeded. If the dielectric constant drops, the current decreases. Then, the voltage signal from the current detector attenuates. This deteriorates the accuracy of reading of the peak value-measuring circuit and of the A/D converter. In either case, the measuring accuracy is deteriorated.

SUMMARY OF THE INVENTION

It is a primary object of the present invention to eliminate, or at least mitigate, the foregoing drawbacks.

The above and other objects are achieved, according to the present invention, by a dielectric constant-measuring apparatus comprising: a sinusoidal wave generator which generates a sinusoidal wave output voltage of a given amplitude; an amplitude adjuster connected to the generator to derive from the sinusoidal wave output voltage generated by the generator an adjusted sinusoidal wave voltage having an amplitude determined by a reference signal; a voltage electrode and a current electrode disposed parallel to the voltage electrode and defining with the voltage electrode a sample holding space in which a sample is held between the electrodes; means connected for applying the adjusted sinusoidal wave voltage to the voltage electrode in order to produce a current flow through a sample in the sample holding space and through the current electrode; a current detector connected for receiving the current flowing through the current electrode and for producing a signal voltage having an amplitude proportional to the amplitude of the current flowing through the current electrode for a current range determined by a control signal supplied to the current detector; a peak value measuring device connected to the current detector for producing an indication of the peak value of the signal voltage amplitude; an A/D converter connected to the peak value measuring device for converting the indication produced by the peak value measuring device into digital peak value signal; a data input unit connected to the A/D converter for reading the digital peak value signal from the A/D converter; an arithmetic unit connected to the data input unit for calculating a reference signal value which will cause the adjusted sinusoidal wave voltage to have an amplitude that will cause the peak value of the signal voltage amplitude produced by the current detector to be between selected upper and lower limits, and for calculating a selected range for the current received by the current detector; and a data output unit connected to the arithmetic unit for producing a first signal having the reference signal value calculated by the arithmetic unit and delivering the first signal to the amplitude adjuster as the reference signal, and for producing a second signal representing the selected range calculated by the arithmetic unit and supplying the second signal to the current detector as the control signal.

In the operation of the above-described apparatus, the sinusoidal wave generator produces a sinusoidal wave. This wave is modified to a given voltage by the amplitude adjuster, and the given voltage is applied to the voltage electrode.

At this time, a current according to the nature of the sample is induced in the current electrode. This current is converted into a voltage signal by the current detector and measured as a current peak value by the peak value-measuring device.

The measured current peak value is converted into digital form and then accepted into the arithmetic portion. If the peak value is outside the desired range, the amplitude adjuster adjusts the amplitude of the sinusoidal wave voltage applied to the voltage electrode. In this way, the current peak value is adjusted. However, if a sufficient adjustment is not made by the amplitude adjuster, the range of the current detector is switched to another range. The current peak value is again adjusted.

After performing one or more such adjustments, the peak value is brought within the desired upper and lower limits. Under this condition, the dielectric constant is measured. At this instant, the current peak value is substantially constant and so the measuring accuracy does not depend on the dielectric constant of the sample. Hence, the object, i.e. an accurate measurement, is achieved.

DESCRIPTION OF THE PREFERRED EMBODIMENTS

One embodiment of the invention is hereinafter described in detail by reference to the drawings.

Figure 1:
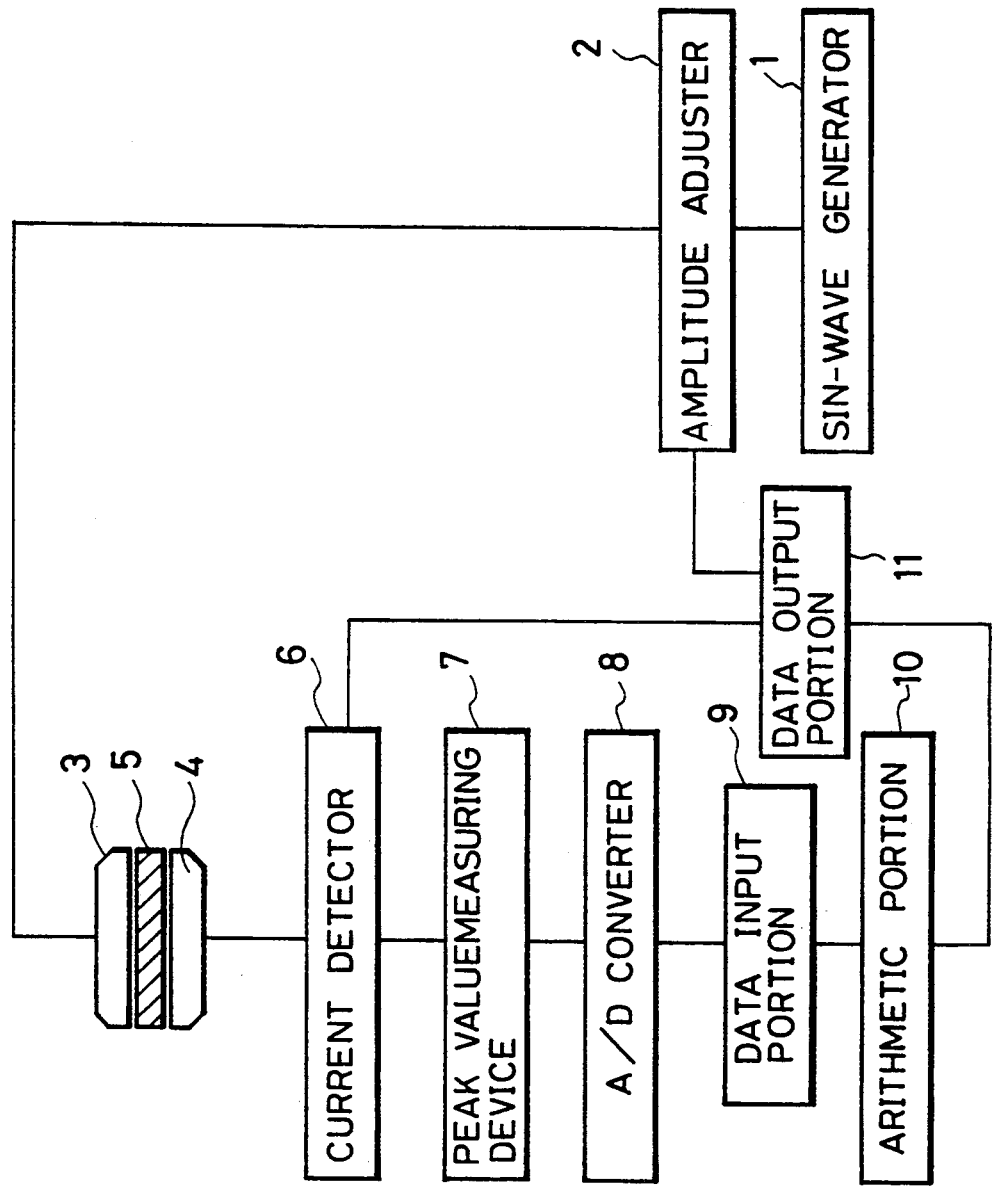
FIG. 1 is a circuit block diagram of one embodiment of apparatus according to the invention.

In FIG. 1, a sinusoidal wave generator 1 produces a sinusoidal wave voltage. The sinusoidal wave voltage generated by the sinusoidal wave generator is applied to an amplitude adjuster 2, which delivers an adjusted sinusoidal wave voltage to a voltage electrode 3, the amplitude of the adjusted sinusoidal wave voltage being proportional to a signal from a data output portion 11.

A sample 5 is sandwiched between voltage electrode 3 and a current electrode 4. An electrical current dependent on the nature of sample 5 is induced in a current electrode 4 and converted into a voltage signal by a current detector 6. The voltage signal produced from the current detector 6 is applied to a peak value-measuring device 7, where the peak value of the voltage signal representing the current conducted by electrode 4 is measured as a current peak value.

The measured current peak value is converted into digital form by an A/D converter 8. The digital current peak value from the converter 8 is applied to a data input portion 9. Data representing the current peak value sent to the data input portion 9 is supplied to an arithmetic portion 10 connected with the data input portion 9. The arithmetic portion performs a calculation (described later).

The result of the calculation performed by the arithmetic portion 10 is sent to the amplitude adjuster 2 via the data output portion 11. Both amplitude adjuster 2 and current detector 6 are connected with the data output portion 11. The amplitude of the sinusoidal wave voltage output from the sinusoidal wave generator 1 is adjusted by amplitude adjuster 2 in response to an adjustment signal from data output portion 11, and this adjusted voltage output is applied to the voltage electrode 3.

If a sufficient adjustment is not made by the amplitude adjuster 2, the arithmetic portion 10 performs a calculation. The result is supplied to the current detector circuit 6 which is connected with the arithmetic portion via the data output portion 11. The detection range of current detector 6 is switched to a different range. Then, in response to the new peak current data, amplitude adjuster 2 is controlled, as described above, to make a further voltage output amplitude adjustment.

It is assumed that the amplitude adjusting signal to the amplitude adjuster 2 is a nonzero constant value a. The adjusted sinusoidal wave is applied to the voltage electrode 3. At this time, the current through sample 5 is induced in the current electrode 4. This current is converted into a voltage signal by current detector 6. The output from current detector 6 is supplied to peak value-measuring device 7. Thus, an analog signal indicative of the peak value of the current through sample 5 is obtained. This signal is converted into digital form by A/D converter 8 and accepted into arithmetic portion 10 via data input portion 9.

In arithmetic portion 10, upper and lower limits for permitting accurate measurement of the current peak value have been previously established. A decision is made in arithmetic portion 10 to ascertain whether the measured value of the current peak value lies between the established upper and lower limits. If this requirement is not satisfied, a calculation is performed to modify the amplitude of the sinusoidal voltage wave that is the output from amplitude adjuster 2.

The calculation may be based on the following equation:

$$\frac{\text{desired adjusted voltage amplitude}}{\text{present adjusted voltage amplitude}} = \frac{(I_l + I_u)}{2I_{pp}} \quad (1)$$

where $I_u$ is the established upper limit of the peak value of the current from electrode 4 or the voltage produced by current detector 6, $I_l$ is the established lower limit of the peak value of the current from electrode 4 or the voltage produced by current detector 6 and $I_{pp}$ is the measured peak value of the current from electrode 4 or the voltage produced by current detector 6.

More specifically, it is assumed that the initial, or present, input value to the amplitude adjuster 2 is a. The arithmetic portion 10 performs a calculation given by $$a' = \frac{a(I_l + I_u)}{2I_{pp}} \quad (2)$$

and a' is the result of the calculation and the new input value to the amplitude adjuster 2.

Equation 1 indicates that the sinusoidal wave voltage applied to the sample 5 is adjusted, by a strictly proportional control, in such a way that the central value $((I_l+I_u)/2)$ of the established peak value conditions is used as a target value. If the current peak value is too high, the sinusoidal wave voltage applied to sample 5 is adjusted so as to reduce the measured current peak value. If the current peak value is too low, the sinusoidal wave voltage applied to sample 5 is adjusted so as to increase the measured value.

Where the peak value conditions cannot be satisfied if the sinusoidal wave voltage applied to the sample 5 is made maximal or minimal, the measuring range signal supplied to the current detector 6 from the arithmetic portion 10 via the data output portion 11 is changed to switch the operation of current detector 6 to another range. Then, the signal to the amplitude adjuster 2 is adjusted so as to satisfy equation 1.

By way of example, current detector 6 may be of a known type having a plurality of current-detecting resistors having respectively different resistance values and means for selectively connecting one of the current-detecting resistors to receive the current through current electrode 4. When the input value a calculated by arithmetic portion 10 corresponds to an adjusted sinusoidal wave voltage amplitude outside of the operating range of amplitude adjuster 2, data output portion 11 will, under control of arithmetic portion 10 produce a measuring range signal which causes the means for selectively connecting to connect another one of the current-detecting resistors to receive the current through current electrode 4, thereby changing the measuring range of current detector 6.

On the other hand, where the result of the comparison shows that the measured value lies between the established upper and lower limits, the dielectric constant is immediately calculated from the result (a') of the calculation made by the arithmetic portion 10, from the measured value ($I_{pp}$) of the current peak value, from the range signal to the current detector signal 6, and from other values.

Accordingly, in the apparatus according to the present invention, the current peak value is substantially constant substantially independently of the dielectric constant of the sample just when the dielectric constant is measured.

Figure 2:
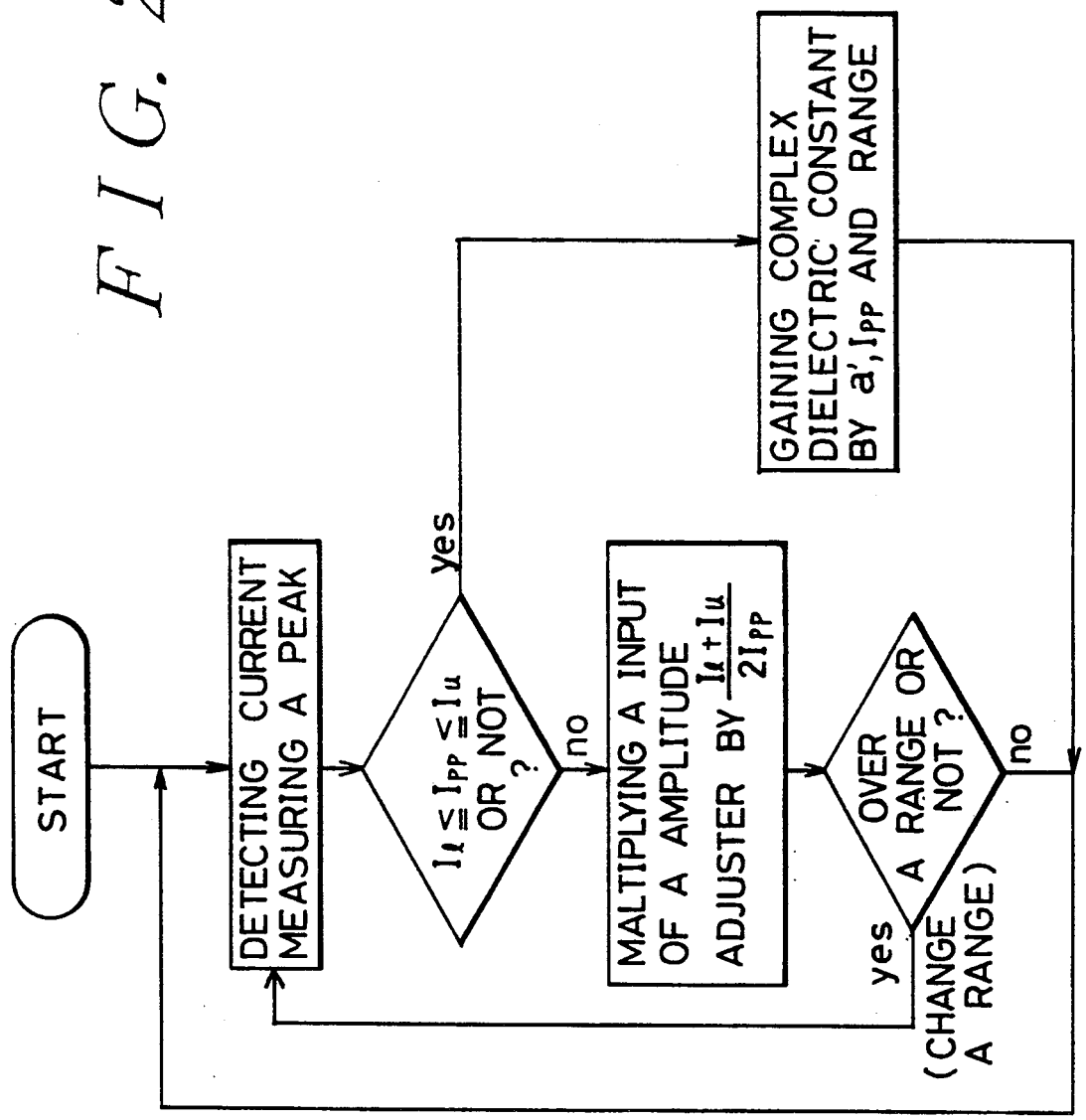
FIG. 2 is a flow chart illustrating the operation of the embodiment of FIG. 1.

A simple flow chart illustrating the foregoing is shown in FIG. 2 and is self-explanatory.

As described thus far, in accordance with the present invention, the voltage amplitude and the range for detection of current are controlled according to the measured current peak value at discrete instants of time. When a dielectric constant is measured, the current peak value is made substantially constant. Therefore, the accuracy at which the current peak value is measured does not depend on the dielectric constant of the sample but is kept almost constant. Furthermore, continuous control is not needed and so the circuitry is simple. Also, high-speed operation is not required. In the above-described control of the current peak value by adjustment of the voltage amplitude, the control can be provided within the range in which the current peak value-measuring circuit has the best characteristics, by appropriately setting the current peak value. The apparatus can increase the measuring accuracy as a kind of automatic gain control system.

The apparatus shown in FIG. 1, and particularly arithmetic portion 10, operate in a simple and straightforward manner and can be easily implemented by workers skilled in the data processing art.

This application relates to subject matter disclosed in Japanese Application number 4-117682, filed on May 11, 1992, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. A dielectric constant-measuring apparatus comprising: a sinusoidal wave generator which generates a sinusoidal wave output voltage of a given amplitude; an amplitude adjuster connected to said generator to derive from the sinusoidal wave output voltage generated by said generator an adjusted sinusoidal wave voltage having an amplitude determined by a reference signal; a voltage electrode and a current electrode disposed parallel to said voltage electrode and defining with said voltage electrode a sample holding space in which a sample is held between said electrodes; means connected for applying the adjusted sinusoidal wave voltage to said voltage electrode in order to produce a current flow through a sample in said sample holding space and through said current electrode; a current detector connected for receiving the current flowing through said current electrode and for producing a signal voltage having an amplitude proportional to the amplitude of the current flowing through said current electrode for a current range determined by a control signal supplied to said current detector; a peak value measuring device connected to said current detector for producing an indication of the peak value of the signal voltage amplitude; an A/D converter connected to said peak value measuring device for converting the indication produced by said peak value measuring device into digital peak value signal; a data input unit connected to said A/D converter for reading the digital peak value signal from said A/D converter; an arithmetic unit connected to said data input unit for calculating a reference signal value which will cause the adjusted sinusoidal wave voltage to have an amplitude that will cause the peak value of the signal voltage amplitude produced by said current detector to be between selected upper and lower limits, and for calculating a selected range for the current received by said current detector; and a data output unit connected to said arithmetic unit for producing a first signal having the reference signal value calculated by said arithmetic unit and delivering the first signal to said amplitude adjuster as the reference signal, and for producing a second signal representing the selected range calculated by said arithmetic unit and supplying the second signal to said current detector as the control signal.

2. The dielectric constant-measuring apparatus of claim 1, wherein said arithmetic unit calculates the reference signal value by the equation:

$$\frac{\text{desired adjusted voltage amplitude}}{\text{present adjusted voltage amplitude}} = \frac{(I_l + I_U)}{2I_{pp}}$$

where $I_u$ is the established upper limit of the peak value of the current from said current electrode or the voltage produced by said current detector, $I_l$ is the established lower limit of the peak value of the current from said current electrode or the voltage produced by said current detector 6 and $I_{pp}$ is the measured peak value of the current from said current electrode or the voltage produced by said current detector, and wherein said current detector has a plurality of current-detecting resistors having respectively different resistance values and means for selectively connecting one of said current-detecting resistors to receive the current through said current electrode, said amplitude adjuster is capable of providing an adjusted sinusoidal wave voltage having an amplitude within a given range, and when the reference signal value calculated by said arithmetic unit corresponds to an adjusted sinusoidal wave voltage amplitude outside of the given range, said data output unit will give the second signal a value which causes said means for selectively connecting to connect another one of said current-detecting resistors to receive the current through said current electrode.

* * * * *